(12) United States Patent
Hertwig et al.

(10) Patent No.: US 8,477,825 B2
(45) Date of Patent: Jul. 2, 2013

(54) POLARIZATION MAINTAINING MULTI-PASS IMAGING SYSTEM FOR THIN-DISK AMPLIFIERS AND OSCILLATORS

(75) Inventors: Michael Hertwig, San Ramon, CA (US); Norman Hodgson, Belmont, CA (US)

(73) Assignee: Coherent, Inc., Santa Clara, CA (US)

( * ) Notice: Subject to any disclaimer, the term of this patent is extended or adjusted under 35 U.S.C. 154(b) by 430 days.

(21) Appl. No.: 12/759,465

(22) Filed: Apr. 13, 2010

(65) Prior Publication Data

US 2011/0249698 A1    Oct. 13, 2011

(51) Int. Cl.
*H01S 3/08*    (2006.01)

(52) U.S. Cl.
USPC ............... 372/99; 372/70; 372/100; 372/101; 372/102; 372/103

(58) Field of Classification Search
USPC ................................................ 372/70, 99–103
See application file for complete search history.

(56) References Cited

U.S. PATENT DOCUMENTS

| | | | |
|---|---|---|---|
| 6,577,666 B2 | 6/2003 | Erhard et al. | |
| 6,778,580 B2 | 8/2004 | Erhard et al. | |
| 6,891,874 B2 * | 5/2005 | Erhard et al. | 372/64 |

FOREIGN PATENT DOCUMENTS

| | | |
|---|---|---|
| DE | 19835107 A1 | 2/2000 |
| WO | 01/57971 A1 | 8/2001 |

OTHER PUBLICATIONS

International Search Report and Written Opinion received for PCT Patent Application No. PCT/US2011/031457, mailed on Oct. 10, 2011, 14 pages.
Krankel et al., "Efficient Continuous-Wave Thin Disk Laser Operation of Yb:Ca4 YO(BO3)3 in E||Z and E||X Orientations with 26 W Output Power", Journal of the Optical Society of America B, vol. 26, No. 7, Jul. 2009, pp. 1310-1314.
Najafi et al., "Simulation of Thin Disk Laser Pumping Process for Temperature Dependent Yb:YAG Property", Optics Communications, vol. 282, 2009, pp. 4103-4108.
Pavel et al., "Multipass Pumped Nd-Based Thin-Disk Lasers: Continuous-Wave Laser Operation at 1.06 and 0.9 μm with Intracavity Frequency Doubling", Applied Optics, vol. 46, No. 34, Dec. 1, 2007, pp. 8256-8263.

* cited by examiner

*Primary Examiner* — Yuanda Zhang
(74) *Attorney, Agent, or Firm* — Morrison & Foerster LLP

(57) ABSTRACT

Multi-pass optical imaging apparatus includes a concave mirror in combination with two retro-reflecting mirror pairs and at least one reflective surface. The mirror, the retro-reflecting mirror pairs and the reflecting surface are arranged such that a light-ray input into the apparatus parallel to and spaced apart from the optical axis of the concave mirror and incident on the concave mirror is caused to be incident on the thin-disk gain-medium at least four times, with each of the four incidences on the gain-medium being from a different direction. If the input ray is plane-polarized, the arrangement provides that the polarization orientation of the ray on each incidence on the gain-medium is in the same orientation.

22 Claims, 10 Drawing Sheets

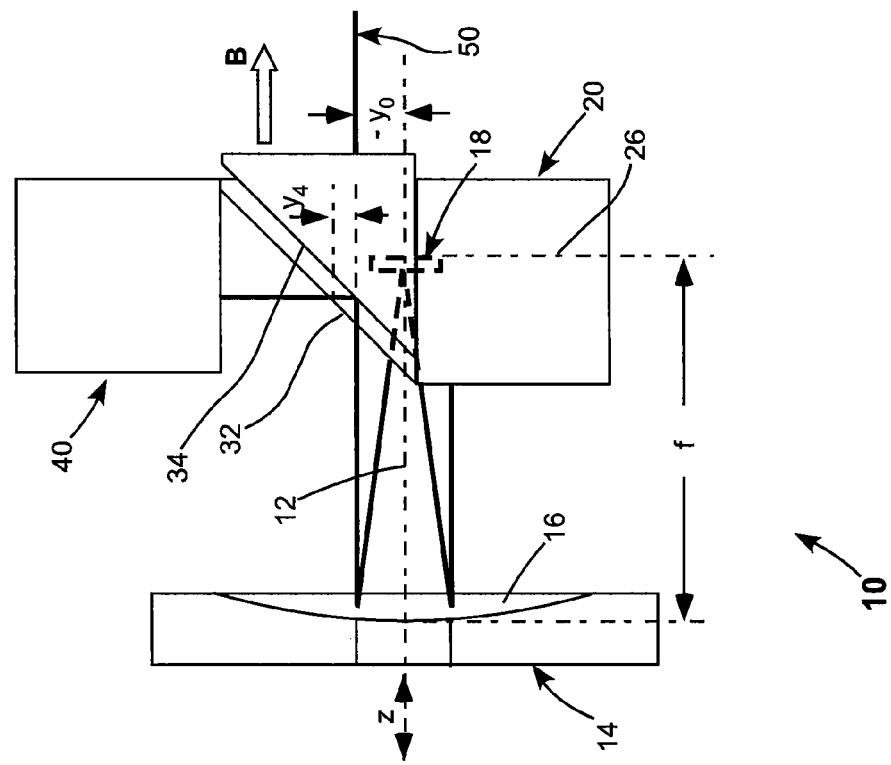
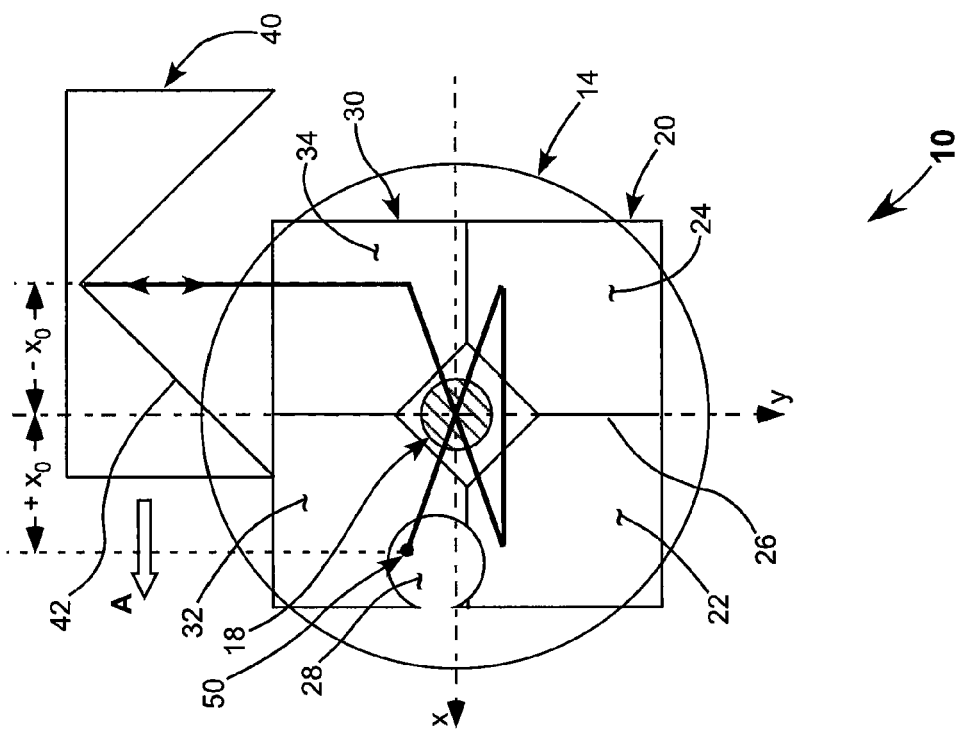
FIG. 1B
FIG. 1A

Calculated Intensity Distribution Contours

Envelope of Electric Field Distribution

Dashed lines indicate incident ray paths

POLARIZATION MAINTAINING MULTI-PASS IMAGING SYSTEM FOR THIN-DISK AMPLIFIERS AND OSCILLATORS

TECHNICAL FIELD OF THE INVENTION

The present invention relates in general to thin-disk lasers and amplifiers. The invention relates in particular to methods of optically pumping a thin-disk laser or amplifier.

DISCUSSION OF BACKGROUND ART

Thin-disk lasers and amplifiers include a solid-state gain-medium in the form of a thin disk. Typically such a thin-disk gain-medium has a diameter between about 5 millimeters (mm) and 50 mm and a thickness between about 50 micrometers ($\mu$m) and 500 $\mu$m. The thin-disk gain-medium has a reflective coating on one surface thereof and is surface-cooled by placing that reflective-coated surface in thermal contact with a heat-sink, which may be actively cooled. Cooling is very effective because of a high surface to volume ratio for the thin-disk. Further, because the surface area of the thin-disk is very much greater than the thickness, heat flow from the thin-disk into the heat sink is essentially unidirectional and in the thickness direction of the thin-disk. This minimizes thermal-lens effects in the gain-medium.

One problem with a thin-disk gain-medium is providing adequate absorption of optical pump radiation. The gain-medium in a thin-disk form can be somewhat more heavily doped than would be a solid-state gain-medium in conventional rod or bar form, but because of the very thin form of the disk, typically no more than about 10% of a pump radiation beam can be absorbed in a forward and reverse pass through the disk via the surface thereof opposite the reflective-coated surface.

Several prior-art schemes having varying degrees of effectiveness and complexity have been proposed for causing a beam of pump radiation to make two or more forward and reverse passes through a thin-disk gain-medium. Many of these, however, do not pay particular attention to the form of the intensity distribution created by the combination of double passes on the disk. Ideally, i.e., for optimum quality of an output laser beam or an amplified signal beam, the intensity distribution of the pump radiation should approximate a radially symmetric Gaussian or Super-Gaussian distribution.

Perhaps the most elegant of prior-art arrangements for multi-pass pumping of a thin-disk gain-medium is an arrangement described in U.S. Pat. No. 6,577,666. This patent was granted to a group of researchers at Universität Stuttgart Institut für Strahlwerkzeuge, where extensive, internationally-recognized development work has been carried out on high-power, thin-disk lasers and amplifiers. This arrangement has been enthusiastically adopted by several manufacturers and developers of thin-disk lasers.

In the arrangement of the '666 patent, a plurality of retro reflecting mirror pairs is used in combination with a parabolic mirror to repeatedly re-image a thin-disk gain-medium, illuminated by the pump beam, back on itself. The prisms are arranged to translate the beam between each imaging incidence on the thin-disk such that the beams progress radially around the parabolic mirror between incidences on the thin-disk. This causes the plurality of re-imaging passes to be distributed in a more or less conical form to achieve a desired radial symmetry of the combined pump-radiation on the thin-disk. In U.S. Pat. No. 6,778,580, the same group also proposes using a similar arrangement for multi-pass amplification of small signals in a thin-disk amplifier.

What appears to have been overlooked in the above-referenced developments, however, is the issue of polarization-plane maintenance of both pump-radiation and signal-radiation. In the above discussed arrangements, as the pump-radiation or signal radiation is successively re-imaged on the thin-disk the image rotates with each successive incidence on the thin-disk. If the radiation is plane-polarized, the polarization-plane also rotates Polarization maintenance can be very important for reasons as follows. Several common sources of optical pump radiation deliver radiation which is plane-polarized. Such sources include single emitter diode-lasers and diode-laser bars including a plurality of emitters. If the radiation is not transmitted through a common optical fiber or bundle, it will stay plane-polarized. Many of the gain-media favored for use in thin-disk form have polarization-dependent absorption at strong absorption peaks or polarization-dependent gain at strong emission wavelengths.

By way of example, single crystal neodymium-doped yttrium vanadate ($Nd:YVO_4$) has a peak absorption at a wavelength of 808 nanometers (nm) and a strong emission line at a wavelength of 1064 nm. The absorption and emission cross-sections are strongest, and significantly so, for radiation plane-polarized parallel to the c-axis of the crystal. If polarization of pump radiation rotates during multi-pass pumping on the $Nd:YVO_4$, the effective absorption of radiation for a given number of incidences on the disk will be reduced from the peak obtainable value.

Similarly, in multi-pass amplification, rotation of the plane of polarization of the signal will reduce the available gain available for a given number of incidences on the thin-disk. Further, the amplifier output will be de-polarized, at least partially. In certain cases where the amplifier output is used directly for an application a depolarized output beam may not present a problem. If, however, the amplifier output is to be frequency-doubled by type-1 frequency-doubling, a plane-polarized output beam is necessary for maximum conversion (doubling) efficiency.

There is a need for a multi-pass imaging arrangement that can preserve the polarization plane of pump-radiation or signal-radiation on a think-disk gain-medium. Preferably the arrangement should retain most if not all of the advantages of the more successful prior-art multi-pass imaging arrangements.

SUMMARY OF THE INVENTION

In one aspect of the present invention, optical apparatus comprises a concave mirror having an optical axis. A thin-disk gain-medium having a reflective backing, is located on the optical axis of the concave mirror facing the concave mirror. A first retro-reflecting mirror arrangement is located below the optical axis of the mirror and facing the concave mirror. A second retro-reflecting mirror arrangement is located above the first retro-reflecting mirror arrangement, above the optical axis of the concave mirror, and facing the optical axis of the concave mirror. At least a first reflecting surface is located between the first and second retro-reflecting mirror arrangements and inclined to the optical axis of the concave mirror. The concave mirror, the first and second retro-reflecting mirror arrangements, the at least first reflecting surface, and the thin-disk gain-medium are cooperatively arranged such that a light-ray entering the apparatus parallel to and spaced apart from the optical axis of the concave mirror and incident on the concave mirror is caused to be incident on the thin-disk gain-medium at least four times, with each of the four incidences thereon being from a different direction.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A and FIG. 1B are elevation views schematically illustrating details of the apparatus of FIG. 1.

DETAILED DESCRIPTION OF THE INVENTION

Figure 1:
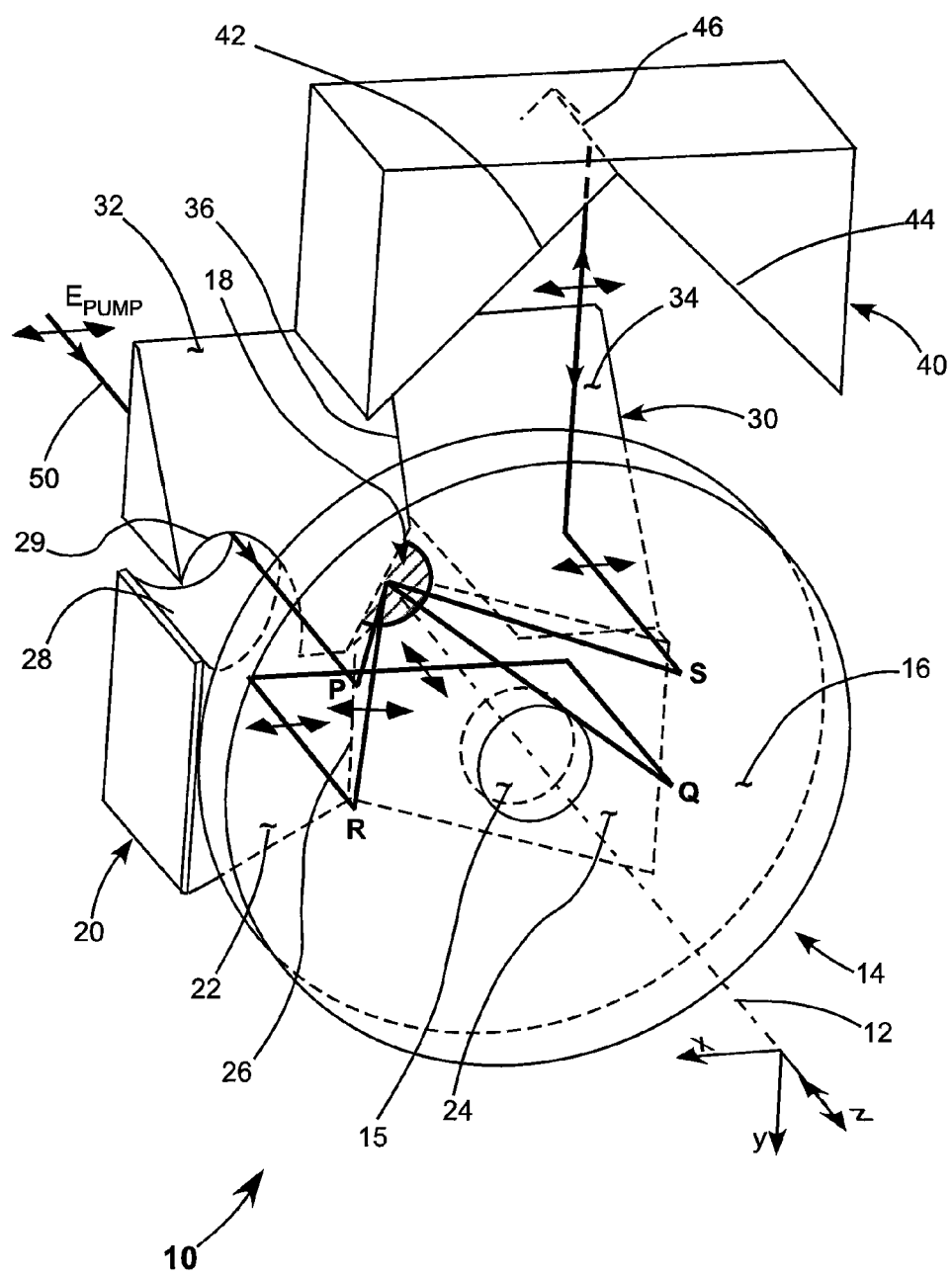
FIG. 1 is a three-dimensional view schematically illustrating one preferred embodiment of a polarization maintaining multi-pass imaging apparatus in accordance with the present invention including a thin-disk gain-medium and a parabolic mirror cooperative with first and second retro-reflecting mirror pairs with apexes thereof perpendicular to each other and with an intermediate splitable reflecting surface therebetween, the mirror, retro-reflectors and intermediate reflecting surface being arranged such that a plane polarized beam of radiation input to the amplifier is successively incident four times on the thin-disk gain-medium without rotation of the polarization-plane of the beam on the thin-disk gain-medium, with an output beam of the apparatus exiting on the same path as the input beam.

Referring now to the drawings, wherein like components are designated by like reference numerals, FIG. 1 schematically illustrates one preferred embodiment of multi-pass system (apparatus) in accordance with the present invention. Further details are depicted in FIG. 1A and FIG. 1B. The invention will be described with reference to exemplary dimensions of one example of apparatus 10. These particular dimensions, of course, should not be construed as limiting Apparatus 10 includes a focusing mirror 14 having a concave reflective surface 16. Surface 16 is preferably parabolic, but could also be ellipsoidal, purely-spherical, or have some other aspheric shape. In the instant example, surface 16 was a parabolic surface of focal length 60 mm. Reflecting surface 16 is depicted in FIG. 1 as transparent to make visible other components of the apparatus and details of ray paths. The optical axis 12 of mirror 14 can be considered a system longitudinal axis (z-axis). Transverse axes (x- and y-axes) are as depicted.

Apparatus 10 is depicted as optically pumping a thin-disk gain-medium 18. The thin-disk gain-medium is shaded in the drawing to indicate that it has a reflective backing. The reflective backing can be a reflective optical coating on the disk or a reflective surface on a heat-sink (not shown) with which the thin-disk is in thermal contact. Thin-disk 18 is located on the z-axis at an axial distance about equal to about the focal length (f) of the mirror from reflecting surface 16 in the instant example this is about 60 mm as noted above. Mirror 14 has an aperture 15 extending therethrough to provide separate optical access to thin-disk gain-medium 18, examples of which are described further hereinbelow.

Cooperative with mirror 14 are: a retro-reflecting prism 20 including reflecting surfaces 22 and 24, inclined at 90° to each other, at 45° to the z-axis and parallel to the y-axis, facing the mirror; a plane reflector 30 formed in two parts 32 and 34 with a joint 36 therebetween aligned with the y-axis, each plane reflector part inclined at 45° to the z-axis and parallel to the x-axis; and a retro-reflecting prism 40 including reflecting surfaces 42 and 44, inclined at 90° to each other, at 45° to the y-axis and parallel to and facing the z-axis.

Those skilled in the optical design art will recognize that while reflecting surfaces 22 and 24, 32 and 34, and 42 and 44 of apparatus 10 are formed, in apparatus 10, as surfaces of prisms (two separate prisms in the case of surfaces 32 and 34), these surfaces could equally well, for purposes of the description and the claims appended hereto, be stand-alone surfaces with the same alignment. Forming the reflecting surfaces on prisms, however, facilitates alignment, and maintenance of the alignment, of the amplifier components in practice.

Continuing with reference to FIGS. 1 and 1A-B, apex 26 of reflecting surfaces 24 and 26 of prism 20 is located on the z-axis at about the same axial distance f from reflecting surface 16 of mirror 14 as is thin-disk gain-medium 18. More precisely, the distance would be equal to $0.5*(2*f-D*f^2)$, where D is the dioptric power of the disk. In the instant example, D is assumed to be zero, which will be true in most cases. Apex 46 of reflecting surfaces of 42 and 44 is preferably located at about the same optical path distance from reflecting surface 16 of mirror 14 as is the apex of surfaces 22 and 24.

Surface 34 can be adjusted for purposes of symmetry of illumination by moving surface 34 in the z-axis direction as indicated in FIG. 1B by arrow B. Such an adjustment causes the y-axis height of surface 32 to be higher than that of surface 34 at the same z-axis position. This is important in cases where more than 4 incidences of the beam on the mirror are required. A purpose of this y-axis height difference is discussed in detail further hereinbelow.

Apparatus 10 is depicted in a basic configuration which will provide for four (4) incidences of a pump radiation beam 50 on thin-disk gain-medium 18. In the drawings, the pump radiation beam is represented by only a single ray for simplicity of illustration.

Beam 50, from a source of pump radiation (not shown), enters amplifier 10, through cut out portions 28 and 29 of prisms 20 and 30, respectively, parallel to the z-axis. Beam 50 is at a distance $x_o$ in the x-axis direction from the z-axis and a distance $-y_0$ in the y-axis direction above the z-axis. These values are dependent on the focal length of mirror 14 inasmuch as they must fall within the clear aperture of the mirror. It is assumed that the beam is plane-polarized, with the polarization-plane, here, arbitrarily, selected as being parallel to the x-z plane, as indicated in FIG. 1 by double arrows $E_{PUMP}$. The polarization-plane of the beam is represented elsewhere in FIG. 1 by similar double arrows, undesignated.

This alignment of the beam causes the beam to be incident on reflective surface 16 at point P and be reflected therefrom onto thin-disk 18 on the z-axis. The beam is reflected from the disk to a conjugate point Q ($-x_0$, $+y_0$) on reflective surface 18. The beam is then reflected parallel to the z-axis onto reflective surface 24 of prism 20. Surface 20 reflects the beam parallel to the x-axis onto surface 22 of prism 20. Surface 22 reflects the beam back onto reflective surface 16 at point R ($x_0$, $+y_0$). The beam is reflected from point R back onto thin-disk 18 on the z-axis, re-imaging the disk, i.e., the portion thereof illuminated by the beam, back onto itself without rotation of the polarization orientation of the beam or the image orientation.

After this first imaging of the thin-disk back onto itself by two incidences of the beam on the thin-disk, the beam is reflected from the disk back onto reflective surface 16 of mirror 14 at point S ($-x_0$, $-y_0$). The beam is reflected parallel to the z-axis and is incident of reflective surface 34 at the same x- and y-coordinates. The beam is reflected parallel to the y-axis, is incident on prism 40 at apex 46 thereof, and is reflected, back along the incident path making two further incidences (and two further imagings) on thin-disk 18, in each case without rotation of the polarization plane and without rotation of the disk-image. Following the fourth incidence, the beam (or what was left of the beam) would be reflected from thin-disk 18 back to point P on reflective surface 16 and be directed out of apparatus 10 through cut-out 28 in prism 20, along the input path of beam 50.

Figure 2:
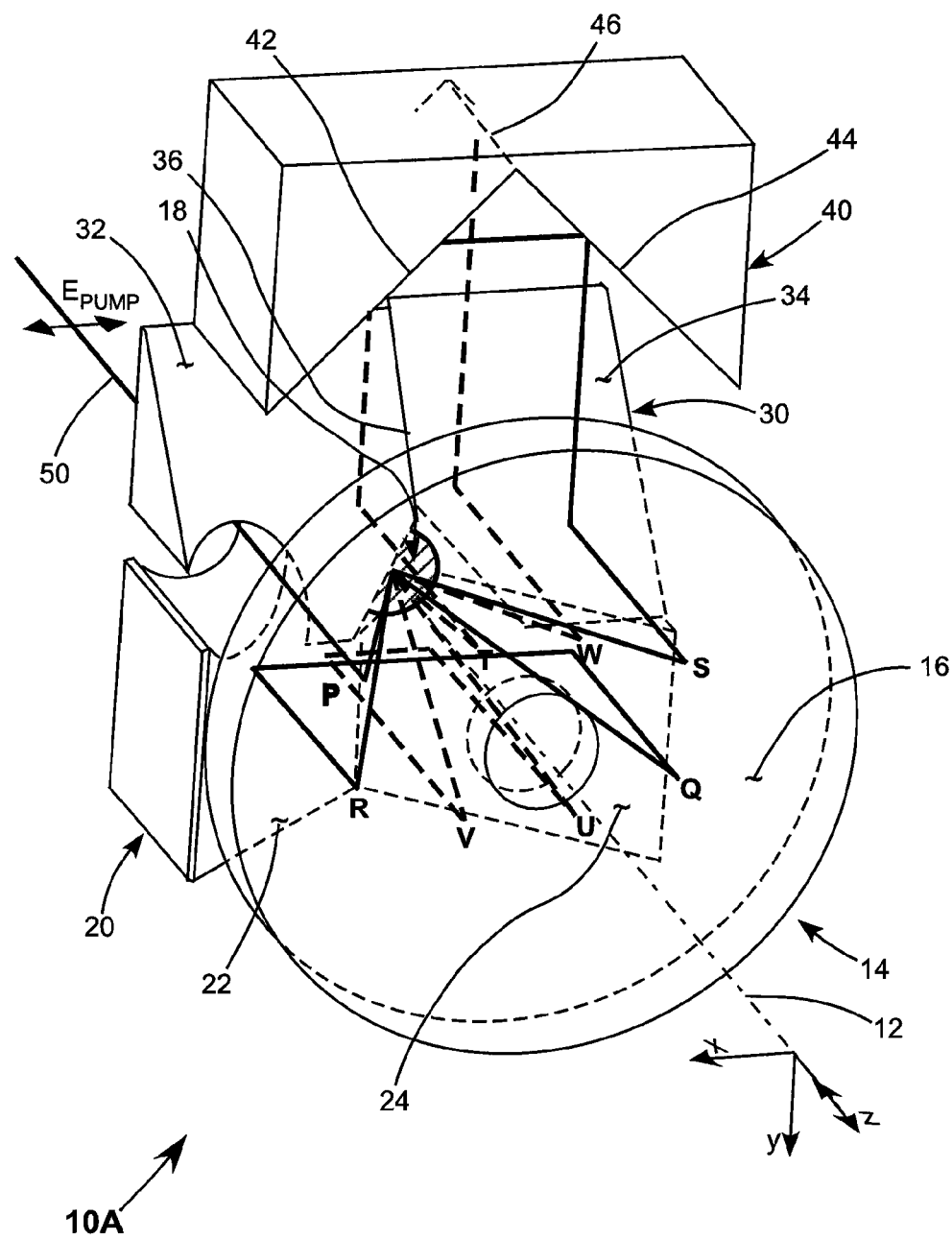
FIG. 2 is a three-dimensional view schematically illustrating one preferred embodiment of a polarization maintaining multi-pass imaging apparatus in accordance with the present invention, similar to the apparatus of FIG. 1 but wherein the retro-reflectors are arranged such that a plane polarized beam of radiation input to the amplifier is successively incident eight times on the thin-disk gain-medium without rotation of the polarization-plane of the beam on the thin-disk gain-medium.

The object of multi-pass pumping, of course, is that sufficient incidences of a pump radiation beam on a thin-disk gain-medium can be made (with a portion of power in the beam absorbed on each incidence) that after the last incidence on the gain-medium there is no useful power left in the beam. Set forth below with continuing reference to FIGS. 1A-B (with exemplary dimensions), and with reference in addition to FIG. 2, is a description of how the number of incidences on thin-disk 18 can be increased from the four incidences of the above described basic configuration to, in theory at least, one-hundred (100) incidences or more.

Increasing the number of incidence to greater than four is effected by translating prism 40 by a predetermined distance towards the z-axis, parallel to the x-axis as indicated in FIG. 1A by arrow A. If the apex 46 of prism 40 is displaced by a distance x to the right of the z-axis where:

$$x = \frac{x_0}{(2n-1)} \quad (1)$$

If n is an integer, then the number of incidences of beam 50 on thin-disk 18 will be equal to 4n. If $x=x_0$, then the number of incidences will be 4, as depicted in FIG. 1.

In the instant example, $x_0$ is equal to $-22.148$ mm and $y_0$ is equal to 7.5 mm. Reflective surface 34 is translated in the direction of arrow B such that the surface height which is $-4.43$ mm in the instant example. That is equivalent to shifting surface 34 along the z-axis by the same amount.

If eight (8) incidences of beam 50 on thin-disk 18 are desired, the apex 46 of prism 40 must be located at $x=x_0/3$, i.e., with n=2 in equation (1), from the z-axis, which is $-7.3826$ mm in the instant example. The surface height difference (at common z location) between surfaces 32 and 34, which has no significant purpose in the case of only four incidences now becomes important for reasons discussed below.

FIG. 2 is a three dimensional view schematically illustrating another embodiment 10A of imaging apparatus in accordance with the present invention, similar to the apparatus of FIG. 1, but with prism 40 translated toward the z-axis as discussed above to provide 8 incidences of beam 50 on thin-disk 18. The initial ray-path is depicted by bold solid lines. Input beam 50 makes the same two incidences on thin-disk 18 and is incident on the same points P, Q, R, and S as in the four incidence case of FIG. 1 after the incidence on the mirror at point S, the beam is directed upward toward retro-reflecting prism 40.

Prism 40 is now closer to the z-axis than in the basic case of FIG. 1, accordingly the beam is incident on surface 44 or prism 40 which directs the mean to surface 42 of the prism on the opposite side of the z-axis. Surface 44 directs the beam (now indicated by a bold dashed line onto reflecting surface 32. The beam is incident on surface 32 closer to the z-axis than point P on reflecting surface 16 and is also higher in the y-axis as a result of the y-axis height distance (at common z-coordinate) of surfaces 32 and 34 of prism 30. The beam now undergoes two more incidences on thin-disk 18, with a corresponding four incidences on reflecting surface 16 of mirror 14. The four incidence points in this case are indicated in FIG. 2 by points T, U, V, and W, which are closer to the Z axis in the x-axis direction and further from the z-axis in the y-axis direction than corresponding points P, Q, R, and S.

After the beam is incident at point W on reflecting surface 16, it is incident on reflecting surface 34 of prism 30 and is directed upward to be incident on apex 46 of retro-reflecting prism 40. This directs the beam first back along the path designated by dashed lines and then, after translation by prism 40, back along the path designated by solid lines, all with polarization maintained as indicated in FIG. 1.

It should be noted here that having a ray path incident on pointed apex 46 of prism 40 could cause scattering or other losses if the apex is improperly formed. One means of avoiding this is to provide a narrow flat portion of the prism in place of the pointed apex. Such a flat portion should only be sufficiently wide enough to accommodate one beam-dimension with some alignment tolerance, thereby allowing all other incidences on the prism to be on surfaces 42 or 44.

For purposes of this description and the claims appended hereto, the term "apex" can interpreted to apply to either a pointed apex of the "flat apex" arrangement discussed above. Such an arrangement can be used without departing from the spirit and scope of the present invention. Further, those skilled in the art will recognize that if only four incidences of beam 50 on thin-disk 18 are required, prism 40 in FIG. 1 could be replaced by could be a single, plane reflecting surface arranged parallel to the x-z plane.

Figure 2A:
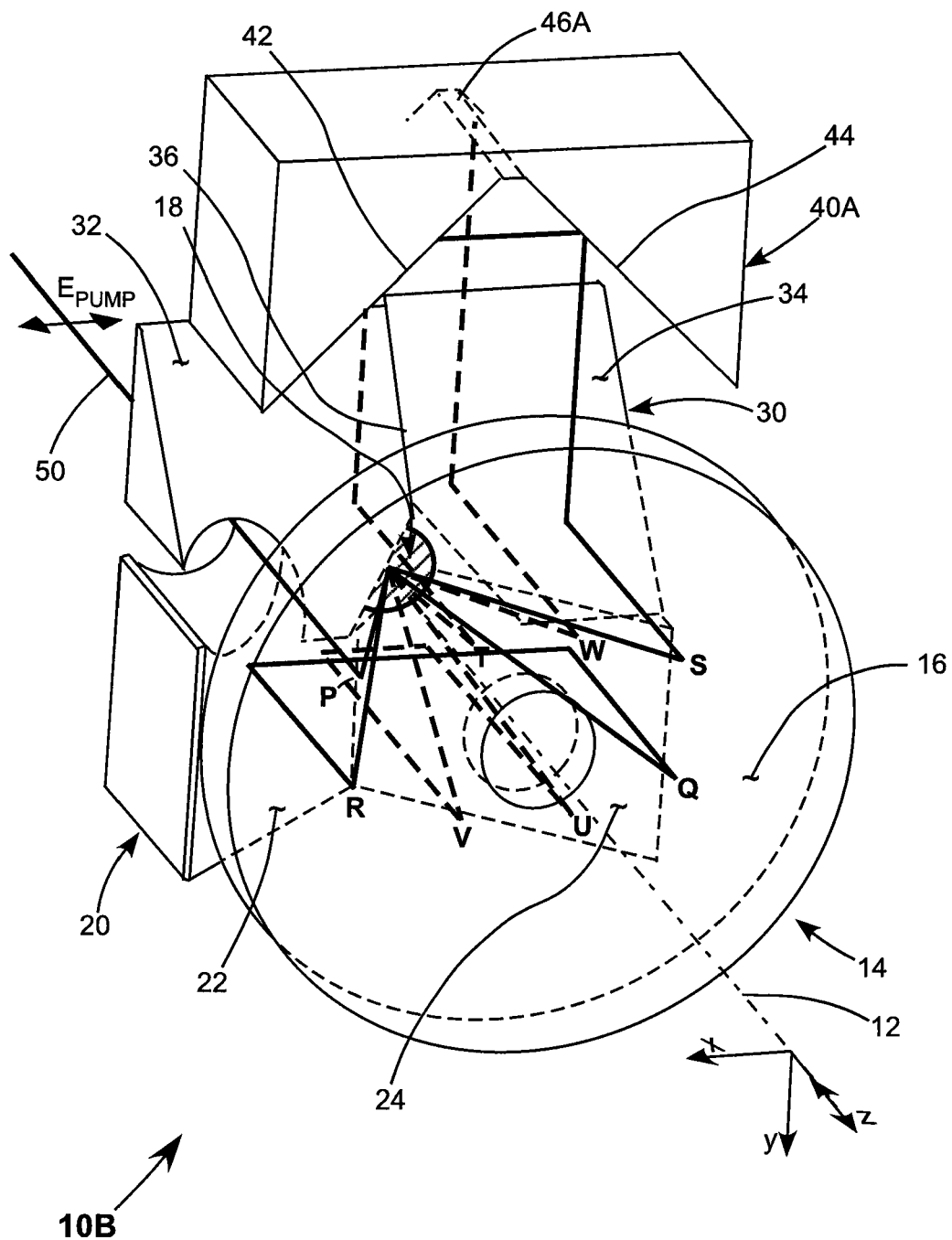
FIG. 2A schematically illustrates a variation of the apparatus of FIG. 2, wherein one of the retro-reflecting mirror pairs has a flattened apex.

FIG. 2A schematically depicts a variation 10B of apparatus 10A of FIG. 2 in apparatus 10B a retro-reflecting prism 40A including a plane (flat) apex 46A replaces prism 40 having a pointed apex 46 in the apparatus 10A. Apparatuses 10A and 10B are identical in all other respects.

Figure 3A:
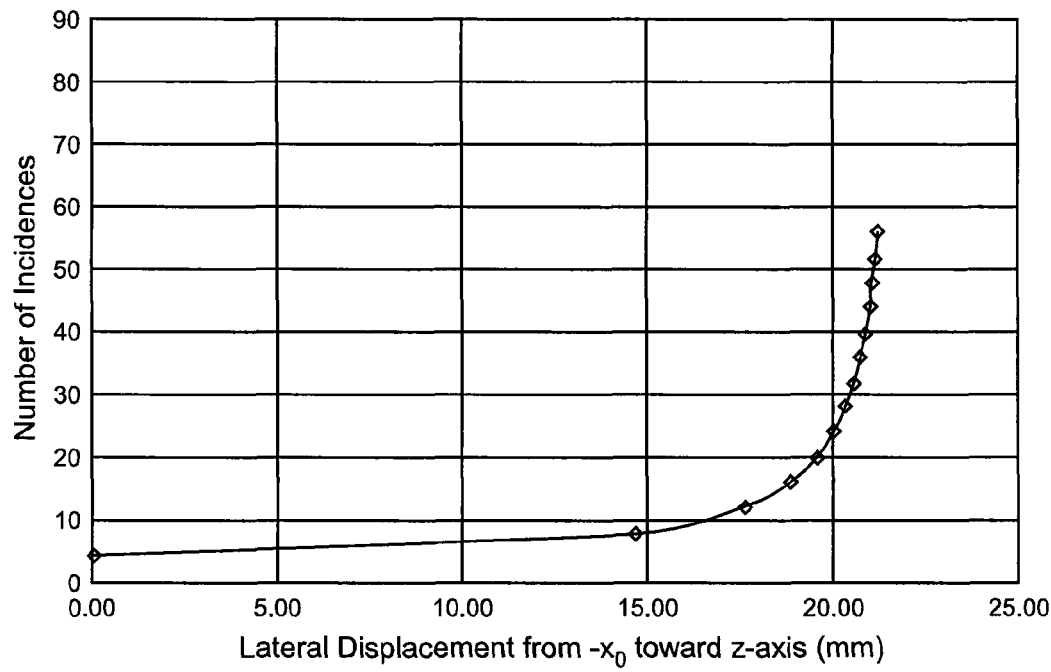
FIG. 3A and FIG. 3B are graphs schematically illustrating the number of beam incidences on the gain-medium as a function of relative position of one of the retro-reflectors in apparatus similar to the apparatus of FIGS. 1 and 2.
Figure 3B:
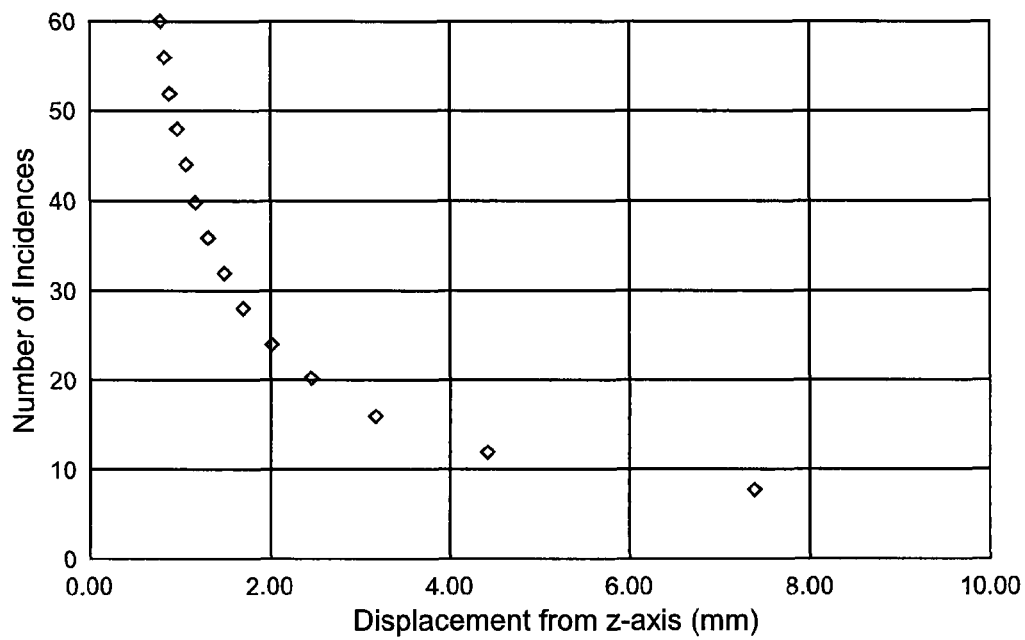

FIG. 3A is a graph schematically illustrating the number of incidences on thin-disk 18 as a function of lateral displacement of the apex of retro-reflecting prism 40 toward the z-axis from the $-x_0$ position in apparatus 10 according to the instant example. FIG. 3B is a graph schematically illustrating the number of incidences on thin-disk 18 as a function of lateral displacement of the apex of retro-reflecting prism 40 from the z-axis toward the $-x_0$ position in apparatus 10 according to the instant example.

The number of incidences increases by 4 from a basic 4, such that as retro-reflecting prism 40 is translated toward the z-axis there will be 8, 12, 16, 20, 24, and so on, incidences when the translation distance is set by an integer value of n. A practical upper limit may be reached due to difficulty of alignment of retro-reflecting prism 40. Twenty-four (24) incidences should be found adequate in most practical cases.

However many beam incidences are selected, if n is an integer, the forward and return beam paths will overlap. There will be a basic pattern of four beam incidences on thin-disk 18 and eight beam incidences on reflective surface 16 of mirror 14. This pattern can be repeated one or more times. This results from two incidences on the disk and four incidences on reflective surface 16 followed by a retro-reflection of the beam back onto reflective surface 16 to provide a further two incidences on the disk and four incidences on the mirror. The sub-pattern of two incidences on thin-disk 18 and four incidences on reflective surface results from the cooperative arrangement of prism 20, mirror 14, and disk 18. The number of retro-reflections of the basic pattern is dictated by the x-axis location of the (apex of) retro-reflecting prism 40.

If the basic pattern is repeated more than once, for every repetition the four incidences on the mirror in the subset of the basic pattern will be moved toward the z-axis in the x-axis direction (due to translation by retro-reflective prism 40) and away from way from the z-axis in the y-axis direction (due to the y-axis height-difference of reflective surfaces 32 and 34 of prism 30) from the previous locations. A result of this is that beam-incidence points on the mirror are distributed on a somewhat diamond-shaped locus with corners thereof about on the x-axis and about on the y-axis. This creates an intensity distribution of pump-radiation on thin-disk 18 which approximates the radially symmetric distribution of prior-art multi-pass imaging systems, while still maintaining the polarization-orientation of the input pump-beam.

It is possible in theory at least that prism 30 could be provided with more than two reflecting surface portions, with different y heights between adjacent portions at common z-coordinate selected such that the distribution of incidence points of the mirror were close to circular. Given the intensity distribution results achieved with only two reflecting portions and the diamond shaped locus, and the fact that a portion of the circular locus would be inaccessible between the P and R, and S and Q points on the mirror, the additional manufacturing and alignment cost of such an arrangement would probably not be justified in most applications.

If n is not an integer there will still be multiple impacts with the number possibly being between or equal to the number for adjacent integer values. However, there will not any beam overlap of forward and return paths to and from 40 and the paths incident on the beam will not be symmetrically distributed about the Z-axis. In certain cases rays may miss a component of the apparatus altogether or hit the wrong component, thereby disrupting the incidence pattern.

Figure 4:
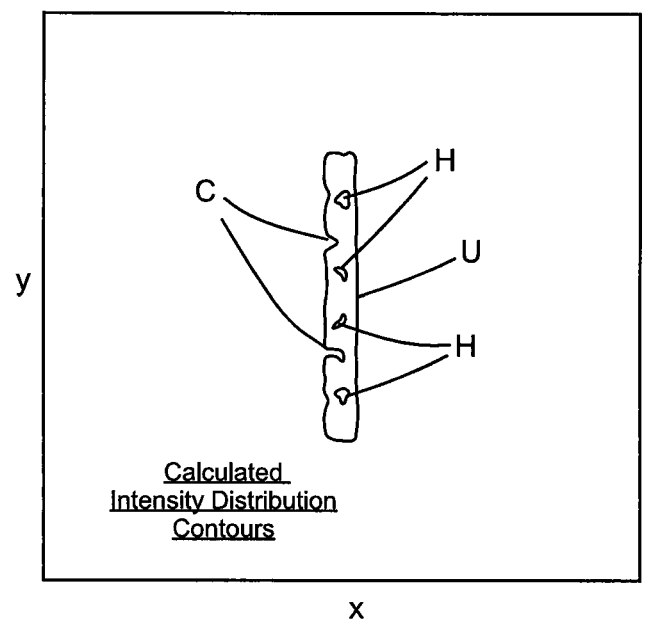
FIG. 4 is a contour plot schematically illustrating intensity distribution on the gain-medium in an imaged linear object thereon in apparatus similar to the apparatus of FIG. 1, but wherein there are 24 beam incidences on the gain-medium.

FIG. 4 is a reproduction of a calculated intensity contour plot of apparatus in accordance with the present invention and the instant example with retro-reflecting prism 40 configured to provide 24 incidences of a pump light beam 50 on thin-disk 18. In this case, the pump beam was assumed to be delivered from an object 0.2 mm high and 0.01 mm wide with the height in the y-axis direction. Ten-thousand rays from the object were traced to provide a total of four-hundred-eighty-thousand individual ray "hits" at a detector plane representing the position of thin-disk 18.

The sum of the 24 images in the detector plane still has the same orientation as the input object indicating that was no rotation of the image between successive ones of the 24 imagings. The intensity distribution was substantially uniform at level U, with only a few isolated "hot spots" H, and isolated "cold spots" C. It is believed that if more rays and more hits were used to form the plot these calculated hot and cold areas would diminish. Some may remain due to the method the calculation software uses to select rays, but it is believed that these would not be present in practice.

Figure 5:
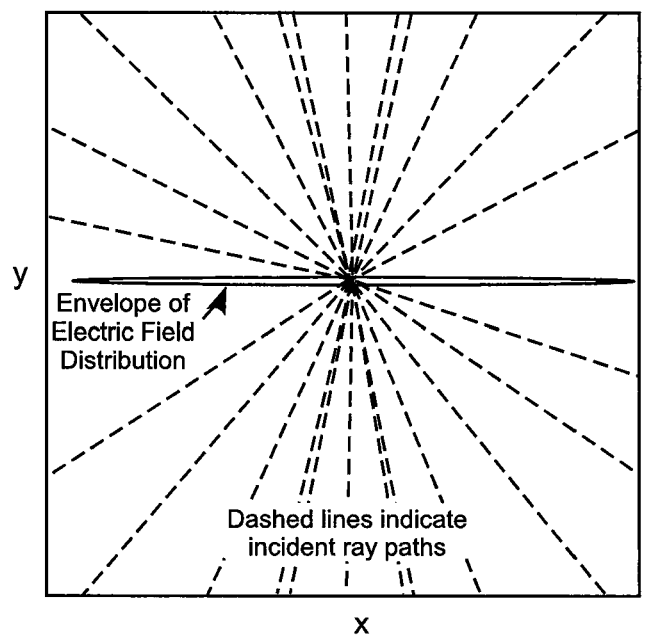
FIG. 5 is a contour plot schematically illustrating aggregate polarization orientation on the gain-medium in apparatus similar to the apparatus of FIG. 1, but wherein there are 24 beam incidences on the gain-medium.

FIG. 5 is a reproduction of a calculated electric-field intensity orientation contour plot of apparatus in accordance with the present invention and the instant example, again with retro-reflecting prism 40 configured to provide 24 incidences of a pump-radiation beam 50 on thin-disk 18. The object in this case was an electric field of one arbitrary unit, plane-polarized with a polarization-plane parallel to the x-axis as indicated in FIGS. 1 and 2. The distribution of the 24 ray incidence paths on the disk is indicated by dashed lines. Note the axi-symmetrical distribution of the paths.

Again, the detector plane in the calculation was arranged to represent thin-disk 18. It can be seen that the sum of the electric-field orientations is contained within an elliptical bound with a major axis in the x-axis much greater than the minor axis. This indicates that there is no significant rotation of the polarization-plane between successive ones of the 24 incidences of the beam on the disk. The very small amount of rotation contributing to the ellipticity is due to a reflection phase difference between P and S polarization orientations of an optical coating on the surface 16 of mirror 14. This phase difference, believed to about $Pi*10^{-3}$, was taken into account in the calculation of FIG. 5.

Figure 6:
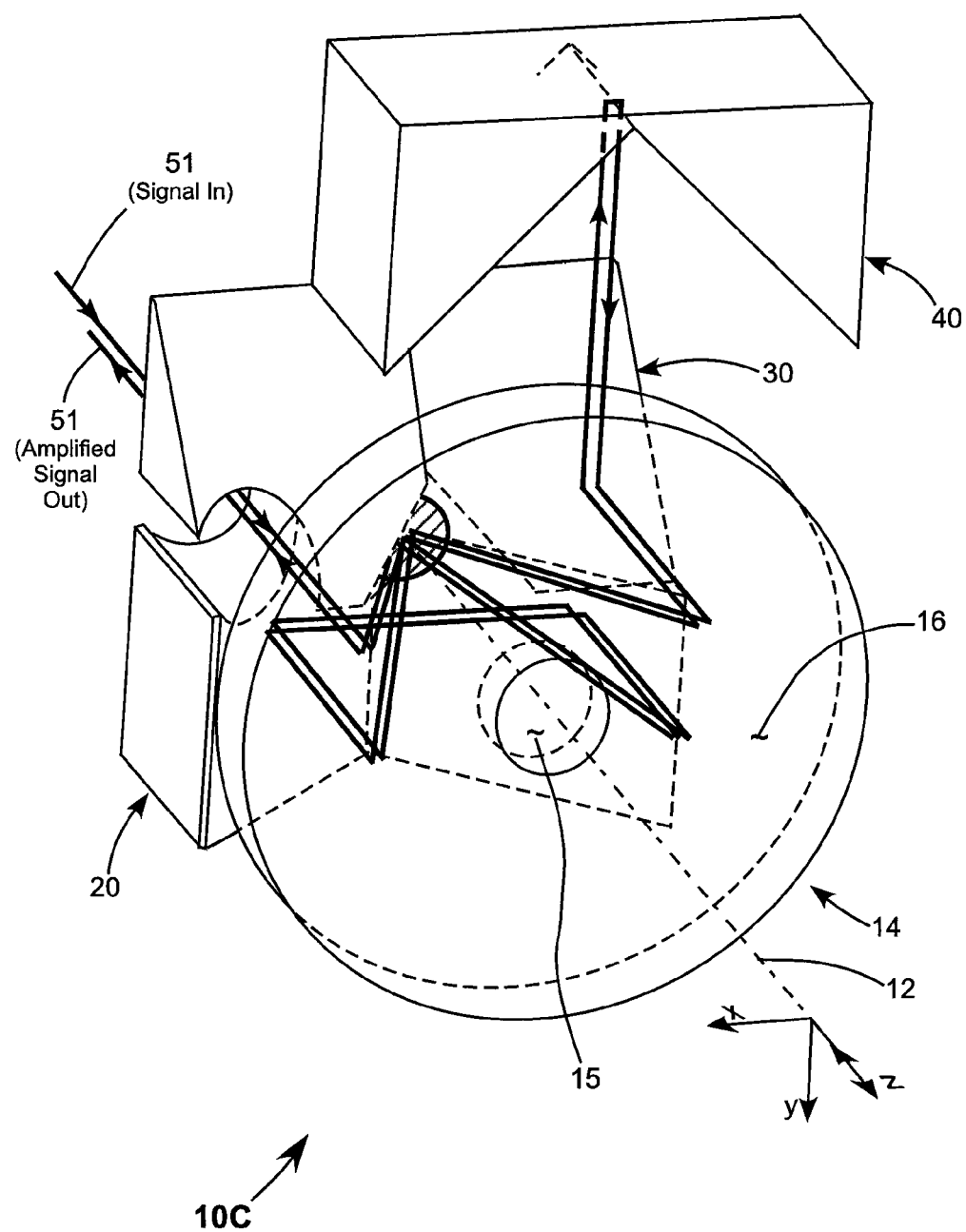
FIG. 6 is a three-dimensional view schematically illustrating yet another preferred embodiment of a polarization maintaining multi-pass imaging apparatus in accordance with the present invention similar to the apparatus of FIG. 1 but wherein output beam exits the apparatus spaced apart and parallel to the input beam.
Figure 6A:
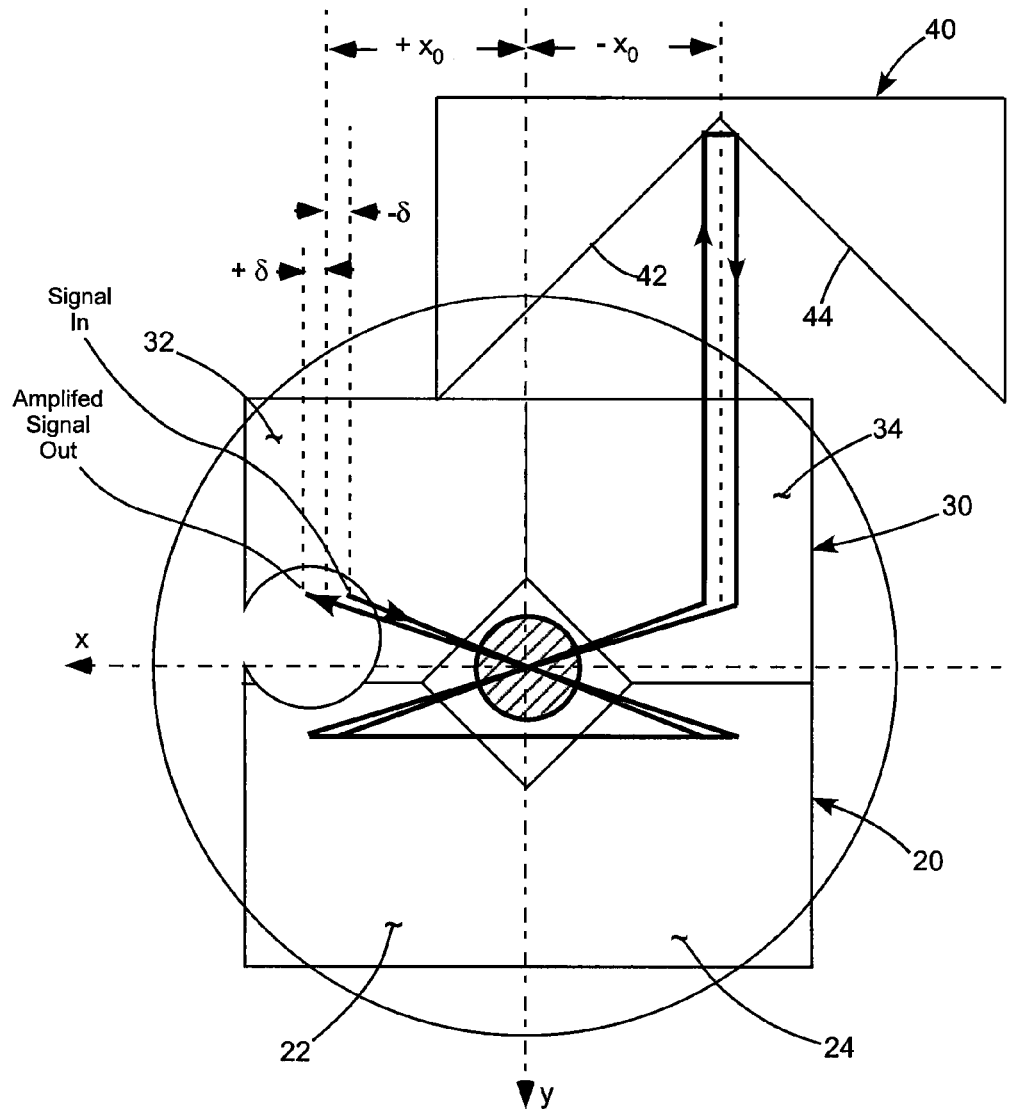
FIG. 6A is a front elevation view schematically illustrating further detail of the apparatus of FIG. 6.

FIG. 6 and FIG. 6A schematically illustrate yet another embodiment 10C of imaging apparatus in accordance with the present invention. Apparatus 10C is similar to apparatus 10 of FIG. 1 with an exception that the apparatus is configured such that a beam of radiation entering 51 entering the apparatus is not reflected back from retro-reflecting prism 40 along the path taken to reach the prism but on a path laterally displaced from that path. This arrangement would be suitable if the input beam (Signal In) were to be progressively amplified by multiple interactions with thin-disk gain-medium 18, as the amplified beam (Amplified Signal Out) exits the apparatus laterally displaced in the x-axis direction from the input beam. This allows a simple physical separation of the input and output beams.

Referring to FIG. 6A, the separation of the beams depicted is effected by misaligning input beam 51 by a small distance δ in the x-axis direction from the $x_0$ alignment position of beam 50 in FIG. 1A, with the height above the z-axis ($-y_0$) remaining the same. This is depicted in 6A wherein the input beam is at $x_0-\delta$. This misalignment causes the input beam to be incident of reflecting surface 42 of prism and retro-reflected back from reflecting surface 44 of the prism. The output beam exits the apparatus, parallel to the z-axis aligned with $x_0+\delta$ at height $-y_0$ above the z-axis, i.e., parallel to the input beam.

If δ is kept relatively small, the forward and retro-reflected ray paths will be symmetrically distributed about the z-axis, without rotation of the polarization-plane between successive incidences on thin-disk 18. In the instant example, wherein $x_0$ is 22.148 mm, a displacement δ of 0.5 mm was found to be convenient. It is also possible to cause separation of input and output beams by having the input beam aligned at $x_0$, $-y_0$ as in FIG. 1A but displacing the apex of prism 40 by less than dictated by n in equation (1) being an integer. This however could lead to results discussed above.

Clearly, if the signal beam is to be amplified, thin-disk gain-medium 18 must be optically pumped by some means. In apparatus 10C, a pump radiation beam could be combined with the input beam by a dichroic filter or the like. This, however, provides that the number of pump-beam incidences and signal beam incidences on thin-disk 18 is the same, which may or not be convenient. It may be possible to create a different number of pump-beam and signal-beam incidences by having the pump and signal beams enter the apparatus at different heights above the z-axis.

Figure 7:
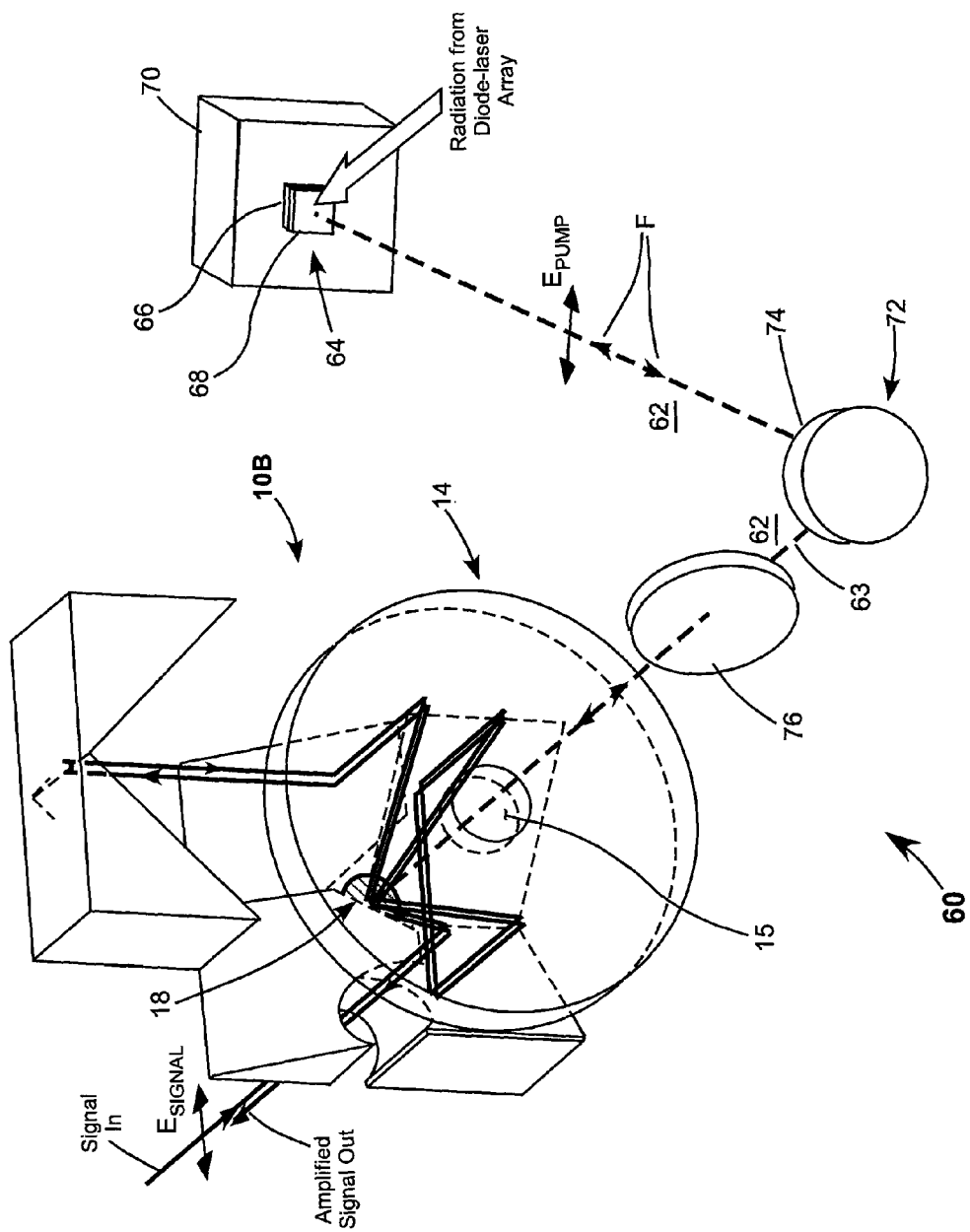
FIG. 7 is a three-dimensional view schematically illustrating a preferred embodiment of a thin-disk amplifier in accordance with the present invention including the apparatus of FIG. 6 used to cause multiple incidences of a signal beam on the gain-medium while the gain-medium is optically pumped by radiation circulating in an OPS-laser resonator through an aperture in the mirror of the apparatus.

It may be found convenient to use the inventive multi-pass imaging apparatus exclusively for either the pump radiation or signal radiation and to make use of aperture 15 in mirror 14 to optically access thin-disk 18 with signal radiation or pump radiation, respectively. A description of one such arrangement wherein the inventive imaging apparatus is used to provide multiple signal beam incidences on thin-disk gain-medium 18 is set forth below with reference to FIG. 7.

Here, a thin-disk amplifier 60 in accordance with the present invention includes apparatus 10C of FIG. 6, including thin-disk gain-medium 18. It is assumed that the gain-medium 18 has a peak-gain cross-section and peak pump-radiation absorption cross-section in the same crystal axis of the gain-medium. A laser resonator 62 is formed between the reflective backing of thin-disk 18 and a mirror structure 66 of an optically pumped semiconductor (OPS) laser chip 64. The resonator has a longitudinal axis 63 co-axial with the optical axis of mirror 14. Resonator 62 is folded by a concave reflecting surface 74 of a mirror 72. OPS chip 64 includes a multi-layer semiconductor surface emitting gain-structure surmounting mirror structure 66. Gain structure 66 is optically pumped by laser radiation from a diode-laser array. The OPS-structure is supported on a heat-sink 70.

A multilayer semiconductor gain-structure has a relatively broad gain-bandwidth, for example, about 30 (nanometers) nm for a peak-gain (center) wavelength of about 808 nm. Such a gain-structure does not have any significant polarization dependence. A birefringent filter 76 is located in laser resonator 62. Filter 76 is inclined at about the Brewster angle and selects a pump wavelength from within the gain bandwidth of the OPS gain-structure. The Brewster orientation causes circulating radiation, indicated by arrows F to be plane-polarized. This circulating radiation pumps gain-medium 18, with absorption by the gain-medium extracting the pump radiation from resonator 62.

In this arrangement, the birefringent filter is oriented to cause the polarization-plane of the circulating pump radiation $E_{PUMP}$ to be aligned with the polarization-plane $E_{SIGNAL}$ of signal radiation entering apparatus 10C. Thin-disk gain-medium 18, of course would be oriented such that the crystal-axis of maximum gain and maximum absorption is aligned with the polarization-planes of the pump- and signal radiation.

Those skilled in the art will recognize that pumping gain-medium 18 of amplifier 60 by an OPS-laser is not the only means of pumping the gain-medium. Any other laser such as a solid-state laser or an extended cavity diode-laser may be used without departing from the sprit and scope of the present invention. Pumping through aperture 15 of mirror 14 with a non-resonant multi-pass arrangement is also possible.

Figure 8:
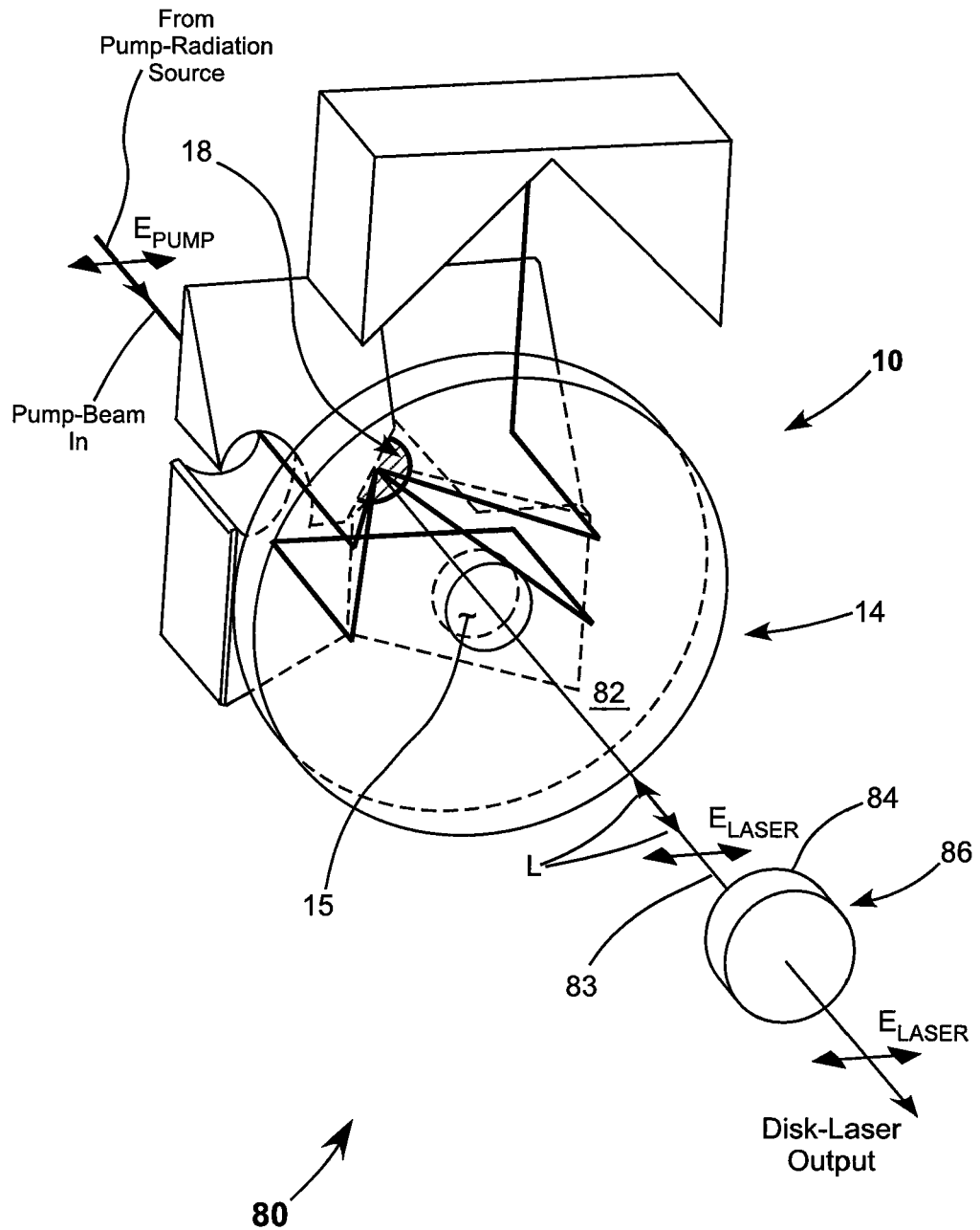
FIG. 8 is a three-dimensional view schematically illustrating a thin-disk laser in accordance with the present invention including the apparatus of FIG. 1 used to cause multiple incidences of a pump-radiation beam on the gain-medium, a reflective backing of the gain-medium providing one end-mirror of a laser resonator extending through an aperture in the mirror of the apparatus.

FIG. 8 is a three-dimensional view schematically illustrating a thin-disk laser 80 in accordance with the present invention. Thin-disk laser includes apparatus 10 of FIG. 1 used to optically pump thin-disk gain-medium 18. Here again it is assumed that that the gain-medium 18 has a peak-gain cross-section and peak pump-radiation absorption cross-section in the same crystal axis of the gain-medium. It is also assumed that the gain in this axis is substantially greater than the gain in the other crystal axes. The gain-medium is oriented such that the maximum gain (and absorption) axis is aligned with the polarization plane $E_{PUMP}$ of pump radiation input into apparatus 80.

A laser resonator 82 is formed between a concave partially reflecting partially transmitting surface 84 of a mirror 86 and the reflective backing of thin-disk gain-medium 18. Resonator 82 has a longitudinal axis 83 co-axial with the optical axis of mirror 14. Optical pumping of gain-medium 18 by apparatus 80 causes laser radiation to circulate in resonator 82 as indicated by arrows L. Laser radiation is delivered from resonator 82 via mirror 86. The laser radiation, here, has a polarization plane $E_{LASER}$ which is established by the polarization dependence of the gain of the gain-medium.

Ray traces and intensity-distribution plots, described and depicted herein, and exemplary dimensions discussed above are reproduced or derived from output of optical design software commercially available from the ZEMAX Development Corporation of Bellevue, Wash. Those skilled in the art using one or more of the embodiments of the present invention described above as a starting guide, may use ZEMAX, or similar commercially available optical design software, to design other embodiments without departing from the spirit and scope of the present invention.

While Nd:YVO$_4$ has been exemplified as a polarization-dependent gain-medium for which the multipass imaging system is useful, the invention may be used with other solid-state gain media with more less polarization-dependent properties. These include but are not limited to ytterbium-doped YAG (Yb:YAG), neodymium-doped YAG Nd:YAG, ytterbium-doped potassium yttrium tungstate (Yb:KYW), ytterbium-doped potassium gadolinium tungstate (Yb:KGW), ytterbium-doped scandium oxide (Yb:Sc$_2$O$_3$), ytterbium-doped lutetium oxide (Yb:Lu$_2$O$_3$), ytterbium-doped glass (Yb:glass), ytterbium-doped yttrium vanadate (Yb:YVO$_4$), chromium-doped zinc selenide (Cr:ZnSe), and titanium-doped sapphire (Ti:sapphire).

In summary, the present invention is described above in terms of a preferred and other embodiments. The present invention is not limited, however, by the embodiments described and depicted. Rather, the invention is limited only by the claims appended hereto.

What is claimed is:

1. Optical apparatus, comprising:
a concave mirror having an optical axis;
a thin-disk gain-medium having a reflective backing, and located on the optical axis of the concave mirror facing the concave mirror;
a first retro-reflecting mirror arrangement located below the optical axis of the concave mirror and facing the concave mirror;
a second retro-reflecting mirror arrangement located above the first retro-reflecting mirror arrangement, above the optical axis of the concave mirror, and facing the optical axis of the concave mirror;
at least a first reflecting surface located between the first and second retro-reflecting mirror arrangements and inclined to the optical axis of the concave mirror; and
wherein the positions and angular orientations of the surfaces of the concave mirror, the first and second retro-reflecting mirror arrangements, the at least first reflecting surface, and the thin-disk gain-medium are cooperatively arranged such that when a light-ray, that is plane-polarized with a predetermined polarization-orientation enters the apparatus parallel to and spaced apart from the optical axis of the concave mirror and is incident on the concave mirror, the light-ray is caused to be incident on the thin-disk gain-medium at least four times, with each of the four incidences thereon being from a different direction and wherein the polarization-orientation of the light-ray is about the same at each of the at least four incidences thereof on the thin-disk gain-medium.

2. The apparatus of claim 1, wherein the optical axis of the concave mirror defines the z-axis of Cartesian x-, y-, and z-axes with the y-axis being a nominally vertical-axis, the x-axis being a nominally lateral-axis, and the z-axis being a longitudinal-axis of the apparatus, wherein the first and second retro-reflecting mirror arrangements each include first and second reflecting surfaces inclined to each other, with adjacent edges thereof meeting at an apex of the arrangement, and wherein the apex of the first retro-reflecting mirror arrangement is located on the z-axis aligned with the y-axis, the apex of the second retro-reflecting mirror arrangement is laterally displaced from the z-axis in the x-axis direction one side thereof, and the at least a first reflecting surface between the retro-reflecting mirror arrangements is parallel to the x-axis and inclined to the y-axis and the z-axis.

3. The apparatus of claim 2, wherein the apex of the first and second reflecting surfaces of the second retro-reflecting arrangement is flat.

4. The apparatus of claim 3, wherein the apex of the first and second reflecting surfaces of the second retro reflecting arrangement is pointed.

5. The apparatus of claim 3, wherein there is defined a maximum x-axis displacement value $x_0$ from the z-axis for the apex of the second retro-reflecting mirror arrangement, this displacement value equal in magnitude to an x-axis incidence coordinate $x_0$, of opposite sign, of the light-ray on the mirror on the opposite side of the z-axis from the apex of the second retro-reflecting mirror pair, and wherein for a displacement x from the z-axis of the apex of the second retro-reflecting mirror pair given by an equation $$x = \frac{x_0}{(2n-1)}$$

if n is an integer, the number of incidences of the light-ray on the thin-disk gain-medium will be equal to 4n.

6. The apparatus of claim 5, wherein the focal length of the concave mirror is about 60 millimeters, and $x_0$ is equal to about 22.15 mm.

7. The apparatus of claim 6, where x is about 7.38 millimeters and the number of incidences of the light-ray on the thin-disk gain-medium is eight.

8. The apparatus of claim 1, wherein the light-ray entering the apparatus is incident first on the concave mirror at a first location thereon, then incident a first time the thin-disk gain-medium, is again incident on the concave mirror at a second location thereon, is then retro-reflected and laterally translated by the first retro-reflecting mirror arrangement back onto the concave mirror at a third location thereon, is then incident a second time on the thin-disk gain-medium, is again incident on the concave mirror at a fourth location thereon, is then incident on the first reflecting surface, is then incident on the second retro-reflecting mirror arrangement and is retro-reflected by the second retro-reflecting mirror arrangement making a further four incidences of the concave mirror and a further two incidences on the thin-disk gain medium.

9. The apparatus of claim 8, wherein, the light-ray is retro-reflected by the second retro-reflection mirror arrangement along the incident path thereof thereon and the further four incidences of the light-ray on the concave-mirror are at the original four locations in reverse sequence, whereby the light-ray is incident on the gain medium only four times, and the light-ray exits the apparatus back along the entrance path thereof.

10. The apparatus of claim 8, wherein, the light-ray is retro-reflected by the second retro-reflecting mirror arrangement and laterally translated by the second retro-reflecting mirror arrangement and makes a further four incidences on the concave mirror and a further two incidences on the thin-disk gain-medium, the further four incidences on the concave-mirror being at different locations from each other and from the original four locations on the concave mirror.

11. The apparatus of claim 10, wherein on retro-reflection and translation from the second retro-reflecting mirror arrangement the light-ray is again incident on the first reflecting surface and after the further four incidences on the concave mirror, the light-ray exits the apparatus along a path spaced-apart from and parallel to the entrance path.

12. The apparatus of claim 10, wherein there is a second reflective surface between the first and second retro-reflecting mirror arrangements, the second reflective surface being parallel to the first reflective surface, on an opposite side of the optical axis of the concave mirror and further above the optical axis of the concave mirror at a common location on the optical axis of the concave mirror, and wherein on retro-reflection and translation from the second retro-reflecting mirror arrangement the light-ray is incident on the second reflecting surface and after the further four incidences on the concave mirror the light-ray is directed back onto the first reflecting surface and then incident a second time on the second retro-reflecting mirror arrangement.

13. The apparatus of claim 12, wherein after being incident the second time on the second retro-reflecting mirror arrangement the light-ray is retro-reflected without translation back along the incident path making a further eight incidences on the concave mirror and a further four incidences on the thin-disk gain medium, with the further eight incidences on the concave mirror being at the same locations as the original eight incidences.

14. The apparatus of claim 12, wherein the original four locations of light-ray incidence on the concave mirror are at points P, Q, R and S thereon, with points P and S being above the optical axis of the concave mirror on opposite sides of the optical axis, and with points R and Q being below the optical axis of the concave mirror on opposite sides of the optical axis, and wherein the further four locations of light-ray incidence on the concave mirror are at points T, U, V and W, points T and W being above the optical axis of the concave mirror on opposite sides of the optical axis, and with points V and U being below the optical axis of the concave mirror on opposite sides of the optical axis, with points T and W being further above but laterally closer to the optical axis than points P and S, and with points U and V being further below but laterally closer to the optical axis than points R and Q.

15. An optical amplifier, comprising:
a thin-disk gain-medium having a reflective backing;
a source of optical pump radiation;
an arrangement for causing a beam of pump-radiation from the source thereof to be incident one or more times on the thin-disk gain-medium for energizing the thin-disk gain-medium;
a concave mirror having an optical axis, the thin disk gain medium being located on the optical axis of the concave mirror facing the concave mirror;
a first retro-reflecting mirror arrangement located below the optical axis of the mirror and facing the concave mirror;
a second retro-reflecting mirror arrangement located above the first retro-reflecting mirror arrangement, above the optical axis of the concave mirror, and facing the optical axis of the concave mirror;
at least a first reflecting surface located between the first and second retro-reflecting mirror arrangements and inclined to the optical axis of the concave mirror; and
wherein the positions and angular orientations of the surfaces of the concave mirror, the first and second retro-reflecting mirror arrangements, the at least first reflecting surface, and the thin-disk gain-medium are cooperatively arranged such that when a light-ray to be amplified enters the amplifier parallel to and spaced apart from the optical axis of the concave mirror and is incident on the concave mirror, the light-ray is caused to be incident on the thin-disk gain-medium at least four times, with each of the four incidences thereon being from a different direction, and with the light-ray being amplified on each incidence as a result of the energizing of the gain-medium by the pump radiation and wherein the polarization-orientation of the light-ray is about the same at each of the at least four incidences thereof on the thin-disk gain-medium.

16. The apparatus of claim 15, wherein the thin-disk gain-medium is a crystal medium and has a maximum gain cross-section in a particular axis of the crystal, and wherein the polarization orientation of the light-ray to be amplified is aligned with the maximum gain cross-section axis of the thin-disk gain-medium.

17. The apparatus of claim 16, wherein the concave mirror has a central aperture therein and the source of optical pump radiation is a laser having a laser resonator formed between the reflective backing of the thin-disk gain-medium and another laser resonator mirror, the laser resonator having a longitudinal axis co-axial with the optical axis of the concave mirror and extending through the central aperture of the concave mirror.

18. A laser, comprising:
a thin-disk gain-medium having a reflective backing;
a source of optical pump radiation for providing a beam of pump-radiation for energizing the thin-disk gain-medium
a laser resonator formed by the reflective backing of the thin disk gain medium and another resonator mirror;
a concave mirror having an optical axis having a central aperture therein, the thin disk gain medium being located on the optical axis of the concave mirror facing the concave mirror, and the laser resonator having a longitudinal axis coaxial with the optical axis of the concave mirror and extending through the central aperture therein;
a first retro-reflecting mirror arrangement located below the optical axis of the concave mirror and facing the concave mirror;
a second retro-reflecting mirror arrangement located above the first retro-reflecting mirror arrangement, above the optical axis of the concave mirror, and facing the optical axis of the concave mirror;
at least a first reflecting surface located between the first and second retro-reflecting mirror arrangements and inclined to the optical axis of the concave mirror; and
wherein the positions and angular orientations of the surfaces of the concave mirror, the first and second retro-reflecting mirror arrangements, the at least first reflecting surface, and the thin-disk gain-medium are cooperatively arranged such that when a beam of pump radiation that is plane-polarized with a predetermined polarization-orientation enters the laser parallel to and spaced apart from the optical axis of the concave mirror and is incident on the concave mirror, the pump beam is caused to be incident on the thin-disk gain-medium at least four times, with each of the four incidences thereon being from a different direction, and with a portion of the pump-radiation beam being absorbed by the thin-disk gain medium on each of the four incidences and wherein the polarization-orientation of the light-ray is about the same at each of the at least four incidences thereof on the thin-disk gain-medium.

19. The apparatus of claim 18, wherein the thin-disk gain-medium is a crystal medium and has a maximum pump-radiation absorption cross-section in a particular axis of the crystal, and wherein the polarization orientation of the pump radiation beam is aligned with the maximum pump-radiation absorption cross-section axis of the thin-disk gain-medium.

20. Optical apparatus, comprising:
a concave mirror having an optical axis;
a thin-disk gain-medium having a reflective backing, and located on the optical axis of the concave mirror facing the concave mirror;
a first retro-reflecting mirror arrangement located below the optical axis of the concave mirror and facing the concave mirror;
a second retro-reflecting mirror arrangement located above the first retro-reflecting mirror arrangement, above the optical axis of the concave mirror, and facing the optical axis of the concave mirror;
at least a first reflecting surface located between the first and second retro-reflecting mirror arrangements and inclined to the optical axis of the concave mirror; and
wherein the concave mirror, the first and second retro-reflecting mirror arrangements, the at least first reflecting surface, and the thin-disk gain-medium are cooperatively arranged such that a light-ray entering the apparatus parallel to and spaced apart from the optical axis of the concave mirror and incident on the concave mirror is caused to be incident on the thin-disk gain-medium at least four times, with each of the four incidences thereon being from a different direction and wherein the optical axis of the concave mirror defines the z-axis of Cartesian x-, y-, and z-axes with the y-axis being a nominally vertical-axis, the x-axis being a nominally lateral-axis, and the z-axis being a longitudinal-axis of the apparatus, wherein the first and second retro-reflecting mirror arrangements each include first and second reflecting surfaces inclined to each other, with adjacent edges thereof meeting at an apex of the arrangement, and wherein the apex of the first retro-reflecting mirror arrangement is located on the z-axis aligned with the y-axis, the apex of the second retro-reflecting mirror arrangement is laterally displaced from the z-axis in the x-axis direction one side thereof, and the at least a first reflecting surface between the retro-reflecting mirror arrangements is parallel to the x-axis and inclined to the y-axis and the z-axis and wherein there is defined a maximum x-axis displacement value $x_0$ from the z-axis for the apex of the second retro-reflecting mirror arrangement, this displacement value equal in magnitude to an x-axis incidence coordinate $x_0$, of opposite sign, of the light-ray on the mirror on the opposite side of the z-axis from the apex of the second retro-reflecting mirror pair, and wherein for a displacement x from the z-axis of the apex of the second retro-reflecting mirror pair given by an equation $$x = \frac{x_0}{(2n-1)}$$

if n is an integer, the number of incidences of the light-ray on the thin-disk gain-medium will be equal to 4n.

21. Optical apparatus, comprising:
a concave mirror having an optical axis;
a thin-disk gain-medium having a reflective backing, and located on the optical axis of the concave mirror facing the concave mirror;
a first retro-reflecting mirror arrangement located below the optical axis of the concave mirror and facing the concave mirror;
a second retro-reflecting mirror arrangement located above the first retro-reflecting mirror arrangement, above the optical axis of the concave mirror, and facing the optical axis of the concave mirror;
at least a first reflecting surface located between the first and second retro-reflecting mirror arrangements and inclined to the optical axis of the concave mirror; and
wherein the concave mirror, the first and second retro-reflecting mirror arrangements, the at least first reflecting surface, and the thin-disk gain-medium are cooperatively arranged such that a light-ray entering the apparatus parallel to and spaced apart from the optical axis of the concave mirror and incident on the concave mirror is caused to be incident on the thin-disk gain-medium at least four times, with each of the four incidences thereon being from a different direction and wherein the light-ray entering the apparatus is incident first on the concave mirror at a first location thereon, then incident a first time the thin-disk gain-medium, is again incident on the concave mirror at a second location thereon, is then retro-reflected and laterally translated by the first retro-reflecting mirror arrangement back onto the concave mirror at a third location thereon, is then incident a second time on the thin-disk gain-medium, is again incident on the concave mirror at a fourth location thereon, is then incident on the first reflecting surface, is then incident on the second retro-reflecting mirror arrangement and is retro-reflected by the second retro-reflecting mirror arrangement making a further four incidences of the concave mirror and a further two incidences on the thin-disk gain medium and wherein the light-ray is retro-reflected by the second retro-reflection arrangement along the incident path thereof thereon and the further four incidences of the light-ray on the concave-mirror are at the original four locations in reverse sequence, whereby the light-ray is incident on the gain medium only four times, and the light-ray exits the apparatus back along the entrance path thereof.

22. Optical apparatus, comprising:
a concave mirror having an optical axis;
a thin-disk gain-medium having a reflective backing, and located on the optical axis of the concave mirror facing the concave mirror;
a first retro-reflecting mirror arrangement located below the optical axis of the concave mirror and facing the concave mirror;
a second retro-reflecting mirror arrangement located above the first retro-reflecting mirror arrangement, above the optical axis of the concave mirror, and facing the optical axis of the concave mirror;
at least a first reflecting surface located between the first and second retro-reflecting mirror arrangements and inclined to the optical axis of the concave mirror; and
wherein the concave mirror, the first and second retro-reflecting mirror arrangements, the at least first reflecting surface, and the thin-disk gain-medium are cooperatively arranged such that a light-ray entering the apparatus parallel to and spaced apart from the optical axis of the concave mirror and incident on the concave mirror is caused to be incident on the thin-disk gain-medium at least four times, with each of the four incidences thereon being from a different direction and wherein the light-ray entering the apparatus is incident first on the concave mirror at a first location thereon, then incident a first time the thin-disk gain-medium, is again incident on the concave mirror at a second location thereon, is then retro-reflected and laterally translated by the first retro-reflecting mirror arrangement back onto the concave mirror at a third location thereon, is then incident a second time on the thin-disk gain-medium, is again incident on the concave mirror at a fourth location thereon, is then incident on the first reflecting surface, is then incident on the second retro-reflecting mirror arrangement and is retro-reflected by the second retro-reflecting mirror arrangement making a further four incidences of the concave mirror and a further two incidences on the thin-disk gain medium and wherein, the light-ray is retro-reflected by the second retro-reflecting mirror arrangement and laterally translated by the second retro-reflecting mirror arrangement and makes a further four incidences on the concave mirror and a further two incidences on the thin-disk gain-medium, the further four incidences on the concave-mirror being at different locations from each other and from the original four locations on the concave mirror.

* * * * *